United States Patent [19]

Anschel et al.

[11] Patent Number: 4,886,727

[45] Date of Patent: Dec. 12, 1989

[54] METHOD FOR DEVELOPING NEGATIVE PHOTORESISTS

[75] Inventors: Morris Anschel, Binghamton; Lawrence D. Goodrich, Newark Valley, both of N.Y.; Barton M. Hetrick, Wayne, Pa.

[73] Assignee: International Business Machines Corporation, Armonk, N.Y.

[21] Appl. No.: 260,820

[22] Filed: Oct. 21, 1988

Related U.S. Application Data

[63] Continuation-in-part of Ser. No. 97,319, Sep. 11, 1987, abandoned, which is a continuation of Ser. No. 801,635, Nov. 25, 1985, abandoned.

[51] Int. Cl.$^4$ .............................................. G03C 5/00
[52] U.S. Cl. .................................... 430/311; 430/325; 430/331
[58] Field of Search ............... 430/311, 325, 330, 331, 430/281, 286

[56] References Cited

U.S. PATENT DOCUMENTS

| | | | |
|---|---|---|---|
| 3,932,297 | 1/1976 | Clementson et al. | 252/171 |
| 4,069,076 | 1/1978 | Fickes | 156/83 |
| 4,162,919 | 7/1979 | Richter et al. | 430/271 |
| 4,320,188 | 3/1982 | Heinz et al. | 430/281 |

OTHER PUBLICATIONS

Kodak, "Photofabrication Methods with Kodak Photo Resist," Bulletin #P-246, p. 19, date unknown.

*Primary Examiner*—Jose G. Dees
*Attorney, Agent, or Firm*—Perman & Green

[57] ABSTRACT

A process is provided for developing images in exposed negative photoresists which comprises treating a substrate coated with the photoresist with a mixture of trichloroethane and from about 5 weight % to about 17 weight % of an aliphatic alcohol, preferably isopropanol or tert-butanol, which is heated to an elevated temperature. The alcohol is present in an amount up to that forming a constant boiling composition (azeotropic compositions).

16 Claims, No Drawings

METHOD FOR DEVELOPING NEGATIVE PHOTORESISTS

BACKGROUND OF THE INVENTION

This is a continuation-in-part of co-pending application Ser. No. 97,319 filed on Sep. 11, 1987, abandoned, which is a continuation of application Ser. No. 801,635 filed on Nov. 25, 1985.

This invention relates generally to a method for developing negative photoresists, and, more particularly, to a trichloroethane-alcohol solution suitable for use in a heated solvent process.

The use of photoresists in the fabrication of integrated circuits is well-known. Typically, the surface of a substrate is cleaned, and the desired photoresist composition is applied, generally by spinning, so as to form a uniform coating of the photoresist on the substrate. The coated substrate is dried to drive off solvents and selected portions in some desired pattern are exposed to electromagnetic radiation, usually in the visible region. During exposure, incident radiation effects a chemical change in the resist film which creates a differential solubility in selected solvents (called "developers") between exposed and unexposed resists. In the case of negative resists, exposed areas become insolubilized in virtually all solvents. Following exposure, the coated substrate is developed by treatment with a solvent. The common methods for developing exposed images in negative resists, such as polyisoprene-type resists, involve dipping or spraying the coated surface with ambient temperature solvents, such as xylene, Stoddard solvents or trichloroethane. Spray techniques have also been employed. However, implicit in these methods are tank-spray evaporative losses and solvent loss from drying. Spray processes, while offering superior removal of unexposed resist, contribute to the loss of exposed resist and image lifting due to mechanical action. Another alternative process, the hot (boiling) solvent process, employs perchloroethane or trichloroethane. This process offers low emissions resulting from the use of vapor degreasing equipment, which has been designed to reduce emissions. However, the hot solvent process has not been found acceptable for fine image work, since the boiling solvent temperatures can cause the resist to reflow, thereby degrading the image.

SUMMARY OF THE INVENTION

In accordance with the invention, a solvent process is provided which retains the exposed image. The process of the invention employs as a developer a mixture of trichloroethane and from about 5 weight % up to about 17 weight % of a short chain aliphatic alcohol, with the alcohol being present in an amount equal to or less than the azeotropic, or constant boiling composition. The mixture is heated to an elevated temperature.

Employing the process of the invention permits development of negative resists comparable to that achieved by present spray processes. Further, the process of the invention can be applied to present conveyorized in-line vapor degreasing equipment, whereby emissions are minimized.

DETAILED DESCRIPTION OF THE INVENTION

The process of the invention for developing exposed negative photoresists on substrates comprises treating the photoresist with a mixture comprising trichloroethane and from about 5 weight % up to about 17 weight % of a short chain aliphatic alcohol. The alcohol is present in an amount equal to or less than the azeotropic (constant boiling) composition.

The trichloroethane is preferably 1,1,1-trichloroethane (methyl chloroform), and preferably includes stabilizing agents, as is well-known in the use of this compound. Such stabilizers, of which one or more may be present, inhibit metal-induced decomposition or hydrolysis of the 1,1,1,-trichloroethane resulting from its use in the degreasing equipment. Any of the conventional stabilizers may be employed, such as dioxane, nitromethane, butylene oxide, amines and methyl isopropyl ketone. Other suitable stabilizers are disclosed in U.S. Pat. No. 4,018,837. Such stabilizers, however, do not form a part of this invention.

The alcohol employed is a short chain aliphatic compound, preferably having from 1 to 4 carbon atoms. Examples include methanol, isopropanol and tert-butanol. Of these, isopropanol and tert-butanol are preferred, with isopropanol being most preferred.

The alcohol is present in an amount equal to or less than the azeotropic composition. In the case of trichloroethane/isopropanol, the azeotropic composition is about 17 weight % isopropanol.

In the processing of semiconductor wafers or printed circuit (PC) boards (plastic or ceramic) to fabricate devices and circuits thereon, there are several stages at which a layer, e.g., an oxide or metal, must be patterned. This is generally accomplished by applying a coating of a photoresist, exposing the photoresist to electromagnetic radiation, such as the visible region, and, in the case of negative photoresists, removing the regions unexposed to the radiation by means of a solvent called a developer. Removal of such selected portions of the photoresist exposes portions of the underlying layer (oxide or metal), which may be removed by treating the so-exposed portions with an etchant that removes the exposed portions of the layer without attacking the remaining photoresist.

For example, in the patterning of a layer, such as a metal layer to form ohmic contacts, a coating of a negative photoresist is applied. An example of such a negative photoresist is a polyisoprene. Other negative photoresists, of course, may also be employed in the practice of the invention. Suitable commercial negative photoresists include KODAK KTFR (Kodak Co., Rochester, N.Y.) and WAYCOAT SC Resists (Hunt Chemical Co., Palisades Park, N.J.).

The surface of the seiconductor wafer or PC board is cleaned as necessary. The coating of negative photoresist is then applied, typically by spinning the photoresist in a suitable solvent to achieve a substantially uniform thickness. The photoresist is dried and/or baked as necessary and is then exposed, employing a mask to delineate regions where non-exposure is desired. Conventionally, a light source (visible region of the electromagnetic spectrum) is employed.

Following exposure, the photoresist is developed in a solvent. In accordance with the invention, the solvent employed is the trichloroethane/alcohol mixture described above.

Subsequent to developing, the remaining photoresist may be treated with one or more solvents to deswell the photoresist as desired. A post-bake may also be done in accordance with conventional processing. The regions of oxide or metal uncovered by the developing process are then etched away, leaving a desired pattern of oxide or metal, covered by the remaining photoresist. The remaining photoresist may be left in place or removed, as desired.

It will be understood that the steps prior to and subsequent to the developing process are conventional in the prior art and hence do not form a part of this invention.

In the process of the invention, the exposed negative photoresist is treated with the trichloroethane/alcohol mixture, heated to an elevated temperature, preferably at or near boiling. In particular, the coated substrate may variously be immersed in the vapors resulting from the heating of the composition dipped in or sprayed with the hot composition. For example, the process of vapor immersion - 30 sec./dip - 60 sec./vapor rinse - 30 sec. has been found to result in development comparable to that obtained from present spray methods. The heating process of the invention is more chemically active than a cool solvent process, although the cool process performs substantially in the same manner, but the immersion time is longer.

As mentioned earlier, boiling trichloroethane without the presence of alcohol causes the resist to reflow. The reflow of the resist causes wetting of chrome and copper surfaces, for example, which results in degradation of the image. However, boiling trichloroethane does provide excellent resistance to etchants (etch undercutting), but can only be used on surfaces covered by a resist of uniform thickness (uniform reflow). With the alcohol present, the etchant resistance is better than that of a cool trichloroethane process, but less than that of pure boiling trichloroethane. On the other hand, the presence of the alcohol results in an image superior to that obtained by using pure trichloroethane.

The isopropanol/trichloroethane mixture employed in the process of the invention performs better than pure trichloroethane at elevated temperatures. The difference in use (hot vs. cool) is the time required to solubilize the unexposed resist. The hot process has the real economic advantage of using presently-employed vapor degreasing equipment for minimum chemical emulsions.

Without subscribing to any particular theory, it appears that the underlying advantage of the process of the invention hinges upon the swelling of the resist. Isoprene resists are developed by hydrocarbon solvents which cause the polymer to swell. Unexposed regions with little to no cross-linking swell to the point of removal (hence the spray advantage). In swelling, the film loses some of its initial adhesion to the surface. This is partially corrected with post-baking.

Alcohol is known to shrink isoprene polymers. If used pure, it shrinks the polymer so much that more adhesion is lost.

By adding from about 5 weight % up to about 17 weight % of alcohol to the initial developing "hydrocarbon" solution, the swelling action is hindered as to keep the film-metal adhesion intact. Since unexposed resist is not cross-linked, it is still solubilized.

EXAMPLES

Example 1

An alumina ceramic substrate was coated with three metal layers: a chrome layer about 80 nanometers (nm) thick, a copper layer about 8,000 nm thick, and a chrome layer about 80 nm thick. A thin coating of KODAK KTFR (about 3,000 nanometers) was sprayed and dried over the top chrome layer. A portion of the photoresist was exposed to 70 millijoules of 360 nm UV light. The unexposed portions of the photoresist were completely removed by treating with a heated mixture of 17 weight % isopropanol, balance trichloroethane, employing the following schedule:

vapor immersion 30 sec.
dip 60 sec.
vapor rinse 30 sec.

The resulting resist images were optically examined at 400X. High resolution images were observed for lines as small as 0.01 millimeter (mm). Following a resist post-bake (120° C., 5 min.), the metal regions not covered by resist were removed by etching the top chrome layer in potassium permanganate, the copper layer in ferric chloride and the bottom chrome layer in potassium permanganate. The remaining photoresist was removed by treatment in a phenol strip solution. An optical measurement of the resultant metal lines showed a 0.1 mm resist line to have produced a 0.08 mm line, with 0.01 mm undercut.

Example 2

An alumina ceramic substrate was coated as in Example 1 with three metal layers of chrome, copper and chrome, followed by the thin coating of Kodak photoresist. The thicknesses of the respective layers was as in Example 1. A portion of the photoresist was exposed to 70 millijoules of 360 nm UV light. The unexposed portions of the photoresist were completely removed by treating with a 25° C. mixture of 17 weight % isopropanol, balance trichloroethane, employing the following schedule:

dip in stirred vessel 60 sec.

The resulting resist images were examined as in Example 1, with high resolution images observed for lines as small as 0.01 mm. Following a resist post-bake under the condition of Example 1, the metal regions not covered by resist were removed employing the etchants listed in Example 1. An optical measurement of the resultant metal lines showed a 0.1 mm resist line to have produced a 0.08 mm metal line, with 0.01 mm undercut.

Example 3

An alumina ceramic substrate was processed as in Example 1, except that tert-butanol was employed in place of the isopropanol. The same schedule for treating the unexposed portions of photoresist was employed. The results obtained were identical to those observed with the substrate in Example 1.

Example 4

An alumina ceramic substrate was processed as in Example 3, except that the tert-butanol was maintained at 25° C. The schedule and the remaining processing was the same as in Example 2. The results obtained were identical to those observed in Example 3.

Example 5

An alumina ceramic substrate was processed as in Example 1, except that the photoresist employed was Hunt WAYCOAT SC negative photoresist. The schedule and the remaining processing was the same as in Example 1. The results obtained were identical to those observed in Example 1.

It is to be understood that the above described embodiment of the invention is illustrative only, and that modifications thereof may occur to those skilled in the art. Accordingly, this invention is not to be regarded as limited to the embodiment as disclosed herein, but is to be limited only as defined by the appended claims.

What is claimed is:

1. A process for developing exposed images in negative isoprene photoresists for the fabrication of integrated circuits comprising treating a substrate coated with the photoresist with a heated mixture of trichloroethane and from about 5 weight % to about 17 weight % of a short chain aliphatic alcohol, said alcohol being present in an amount up to that forming a constant boiling mixture.

2. The process of claim 1 in which said trichloroethane consists essentially of 1,1,1-trichloroethane.

3. The process of claim 1 in which said trichloroethane consists essentially of a stabilized trichloroethane.

4. The process of claim 1 in which said short chain alcohol consists essentially of 1 to 4 carbon atoms.

5. The process of claim 4 in which said short chain alcohol consists essentially of an alcohol selected from the group consisting of methanol, isopropanol and tert-butanol.

6. The process of claim 5 in which said alcohol consists essentially of isopropanol.

7. The process of claim 6 in which said isopropanol is present in said solution in an amount of about 17 weight %.

8. The process of claim 1 in which said substrate is treated with vapors of said heated mixture.

9. A process for developing exposed images in negative photoresists comprising treating a substrate coated with said photoresist with a mixture of 1,1,1-trichloroethane and from about 5 weight % to about 17 weight % of isopropanol, heated to an elevated temperature.

10. The process of claim 9 in which said mixture is heated to boiling and the substrate is treated with the vapors generated thereby.

11. The process of claim 9 in which said isopropanol is present in an amount of about 17 weight %.

12. A process for fabricating devices and circuits on semiconductor substrates, including the steps of:
   (a) forming a coating of a negative photoresist composition on a surface of said substrate;
   (b) exposing portions of said negative photoresist to electromagnetic radiation; and p1 (c) developing the exposed negative photoresist in a solvent, characterized in that said solvent comprises a heated mixture of tricholoroethane and from about 5 weight % to about 17 weight % of a short chain aliphatic alcohol, said alcohol being present in an amount up to that forming an azeotropic composition with said trichloroethane.

13. The process of claim 12 in which said short chain alcohol consists essentially of an alcohol selected from the group consisting of methanol, isopropanol and tert-butanol.

14. The process of claim 13 in which said alcohol consists essentially of isopropanol.

15. The process of claim 14 in which said isopropanol is present in an amount of about 17 weight %.

16. The process of claim 12 in which said substrate is treated with vapors of said heated mixture.

* * * * *